(12) United States Patent
Stahl

(10) Patent No.: US 6,485,314 B1
(45) Date of Patent: Nov. 26, 2002

(54) SPRING ELEMENT

(75) Inventor: Hermann Stahl, Steinheim-Kleinbottwar (DE)

(73) Assignee: Hermann Stahl GmbH, Grossbottwar (DE)

( * ) Notice: Subject to any disclaimer, the term of this patent is extended or adjusted under 35 U.S.C. 154(b) by 0 days.

(21) Appl. No.: 09/958,312

(22) PCT Filed: Apr. 1, 2000

(86) PCT No.: PCT/EP00/02941

§ 371 (c)(1),
(2), (4) Date: Oct. 5, 2001

(87) PCT Pub. No.: WO00/60915

PCT Pub. Date: Oct. 12, 2000

(30) Foreign Application Priority Data

Apr. 8, 1999 (DE) .................................. 299 06 262 U

(51) Int. Cl.[7] ............................................. H01R 13/648
(52) U.S. Cl. ........................ 439/108; 439/95; 439/862; 439/609
(58) Field of Search ................... 439/95, 108, 862, 439/947, 607, 609

(56) References Cited

U.S. PATENT DOCUMENTS 5,233,507 A * 8/1993 Gunther et al. ............. 439/108
5,890,912 A * 4/1999 Jenkins ....................... 439/862
6,120,304 A * 9/2000 Harwood et al. ............. 439/95
6,290,513 B1 * 9/2001 Kakinoki et al. ........... 439/108

* cited by examiner

Primary Examiner—Tho D. Ta
(74) Attorney, Agent, or Firm—Gudrun E. Huckett

(57) ABSTRACT

A springy contact element to be arranged between electrically conducting housing parts, wherein a first housing part has a sheet metal which can be shaped and has a sheet metal tab located within a slot of the sheet metal and forming a unitary part of the sheet metal, is formed by cold forming the sheet metal tab. The sheet metal tab has a thickness reduced relative to a thickness of the sheet metal by cold forming the springy contact element, wherein the springy contact element has an arc-shaped tab portion projecting out of a plane of the sheet metal. The springy contact element has a base portion and is connected with the base portion to the sheet metal. The springy contact element has a support area located at a spacing relative to the base portion, wherein the support area of the springy contact element is supported on at least one support surface of the sheet metal. The at least one support surface of the sheet metal extends transversely to a longitudinal tab axis of the sheet metal tab away from a first longitudinal slot edge and engages underneath the support area.

15 Claims, 2 Drawing Sheets

SPRING ELEMENT

BACKGROUND OF THE INVENTION

1. Field of the Invention

The invention relates to a springy contact element, according to the preamble claim 1, to be arranged between electrically conducting housing parts, in particular, between a plug-in housing and a mounting shaft.

2. Description of the Relevant Prior Art

Electronic devices such as measuring racks or computer units but also devices of the electronic entertainment sector such as, for example, a car radio, must be shielded sufficiently against electromagnetic interfering radiation. The shielding is conventionally achieved by grounding an electrically conducting housing wherein an exchangeable plug-in housing is connected by spring contacts with the ground of the mounting shaft. In this connection, the contact springs must ensure a reliable contacting even for repeated insertion and removal of the plug-in housing.

A contact element of the aforementioned kind is known from DE 195 07 846 C1. The housing part, comprised of a sheet metal that can be shaped, of the plug-in housing or of the mounting shaft has a sheet metal tab formed as a unitary part out of a slot of the sheet metal which, for forming the springy contact element, is reduced by cold forming relative to the thickness of the sheet metal. In this connection, the contact spring is of a wavy shape across its length wherein an individual wave projects arc-like from the plane of the sheet metal. Since the contact element is secured by a base portion on the narrow side of the slot and the wavy shape provides a longitudinal shortening, the contact element, when greatly loaded, penetrates through the slot and, in this connection, an elastic deformation can occur which disturbs reliable contacting. It is therefore also suggested to support the contact spring with its free end on the narrow side of the slot. However, this impairs the shaping because only a minimal longitudinal shortening by shaping is permissible.

SUMMARY OF THE INVENTION

It is an object of the invention to configure a springy contact element of the aforementioned kind such that a high spring stiffness results for a free selection of the shape.

The object is solved according to the invention by the support area of the contact element having correlated therewith a support surface of the sheet metal which extends transversely to the longitudinal tab axis away from the longitudinal slot edge and which engages underneath the support area.

The support surface of the sheet metal correlated with the support area of the contact element extends transversely to the longitudinal tab axis away from the longitudinal edge of the slot so that a support action for the contact element is realized on a configurationally selectable point of the longitudinal edge of the slot. Accordingly, across the entire length of the slot, independent of the shortening resulting from the shaping of the contact element, a reliable support action can be selected which ensures a torsion-free receiving of forces by the contact element. Advantageously, the support surfaces of the sheet metal on the longitudinal tab edges of the slot are positioned at a spacing opposite one another so that to the left and to the right of the longitudinal tab axis at the edge of the slot a support action is provided. A torsion of the contact element formed by the sheet metal tab about the longitudinal tab axis is thus reliably prevented.

Advantageously, the support area at the free end of the sheet metal tab is formed so that its entire length can contribute to the spring properties of the contact element.

Expediently, the greatest width of the support area before cold forming can be slightly greater than the spacing of the support surfaces; this can be achieved, for example, in that the free end is realized with a greater width than the remaining sheet metal tab. Preferably, the support area receives the required width by cold forming in order to rest against the support surfaces of the sheet metal positioned approximately opposite one another at a spacing transversely to the longitudinal slot axis.

When the free end of the sheet metal tab in plan view is formed by cold forming to a disk shape, it is expedient to bend the disk-shaped end approximately about a diameter which is transversely positioned to the longitudinal slot axis so that the disk-shaped end becomes stiffer and can thus dissipate high support forces onto the support surfaces without deformation.

BRIEF DESCRIPTION OF THE DRAWINGS

Further features of the invention result from the additional claims, the description, and the drawing in which embodiments of the invention, to be described in the following in detail, are illustrated. It is shown in:

DESCRIPTION OF PREFERRED EMBODIMENTS

Figure 3:
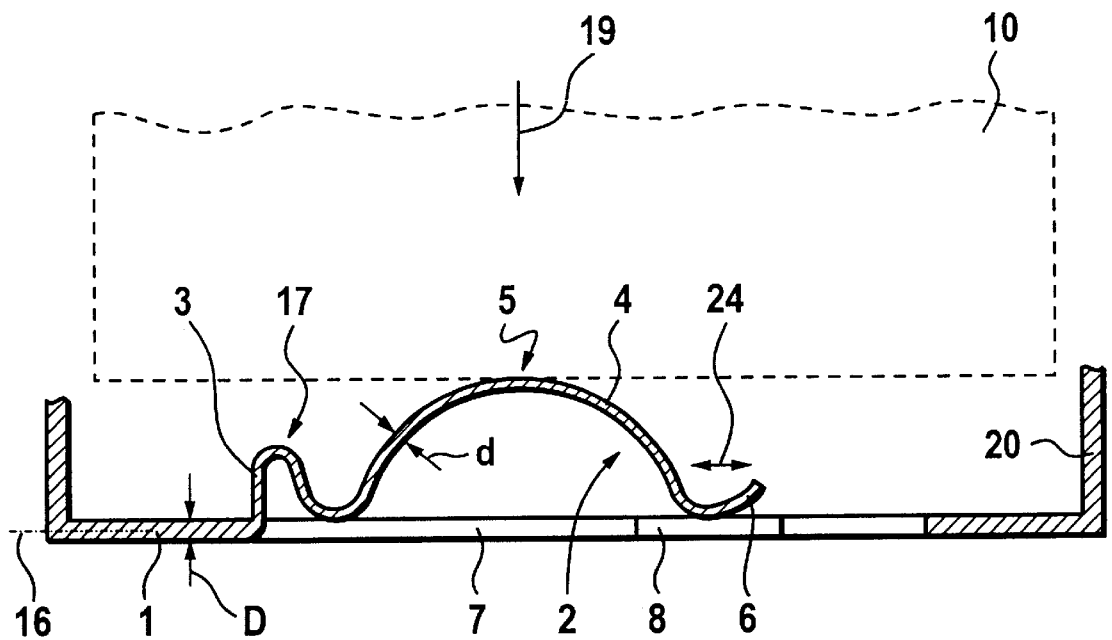
FIG. 3 a section along the line III—III of FIG. 2.

For forming a springy contact element, as illustrated in a side view in FIG. 3, a longitudinal slot 11 is provided in a sheet metal 1 of one of the housing parts 10, 20 and in the slot a sheet metal tab 2 is positioned having a spacing all around. In the embodiment according to FIG. 1, the sheet metal tab 2 adjoins with a base portion 3 a narrow side 12 of the longitudinal slot 11 and extends preferably symmetrically to the longitudinal tab axis 13 up to the narrow side 14. In this embodiment, the sheet metal tab 2 having a width b has at its free end 6 a width B. This width B is greater than the width b wherein the free end 6 preferably has approximately twice the width b of the sheet metal tab 2.

The slot 11 in the area of the free end 6 is provided with an end portion 9 whose width S3 measured transversely to the longitudinal tab axis 13 is greater than the width S1 of the slot portion 7 in which the sheet metal tab 2 is positioned. Between the end portion 9 and the slot portion 7, a narrower portion 8 is provided which is formed by edge portions 15 projecting into the slot 11. The width S2 of the portion 8 measured transversely to the longitudinal slot axis 13 is smaller than the width S1 of the slot portion 7. The width B of the free end 6 of the sheet metal tab 2 is preferably at least slightly greater than the width S2 of the narrower slot portion 8. In the embodiment according to FIG. 1 an overlap u is possible.

Figure 2:
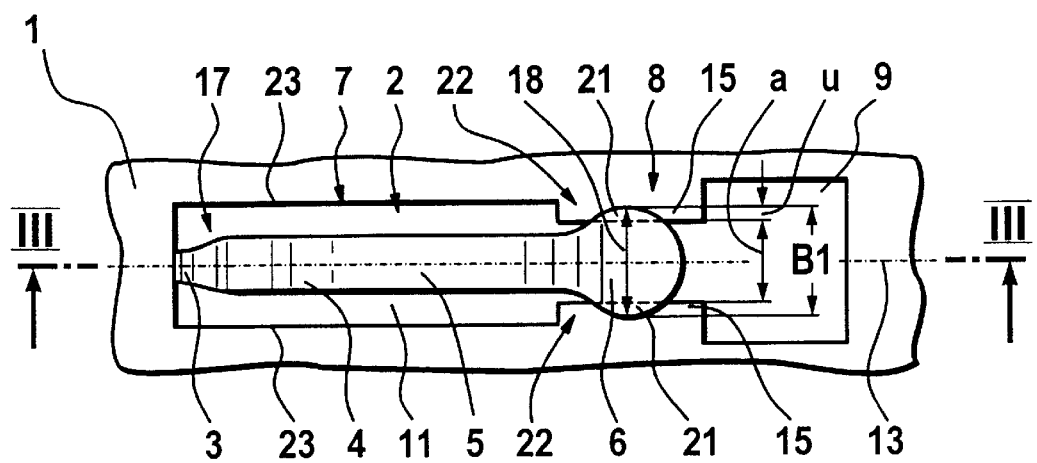
FIG. 2 a plan view onto a sheet metal according to FIG. 1 after cold forming and shaping of the sheet metal tab.

As illustrated in FIG. 2, the sheet metal tab 2, with the exception of the base portion 3, is reduced by cold forming relative to the thickness D of the sheet metal 1 to the thickness d of the sheet metal tab 2 (FIG. 3). Advantageously, at the same time a shaping of the sheet metal tab to the springy contact element can take place, as is illustrated in FIGS. 2 and 3. In this connection, the base portion 3 is bent substantially at a right angle out of the sheet metal plane 16 and its portion 17 adjacent to the sheet metal tab 2 is shaped, in particular, embodied to have an S-configuration. Adjoining the portion 17 is the substantially part-circular sheet metal tab 2 which projects out of the plane 16 of the sheet metal and whose free end 6 is advantageously disk-shaped. For stiffening the free end 6, which in a plan view is disk-shaped, it is bent about a diameter 18 which extends transversely to the longitudinal tab axis 13.

In the illustrated embodiment, the sheet metal 1 is provided at the housing part 20 which represents a mounting shaft. The housing part 10, illustrated in FIG. 3 by dashed lines, forms a plug-in housing which is to be connected in an electrically conducting way by means of the sheet metal tabs 2, embodied as springy contact elements, with the grounded mounting shaft. In this connection, the contact surface 5 of the contact element is positioned between the base portion 2 and the disk-shaped free end 6 approximately at the highest point of the arc-shaped tab portion 4.

When the plug-in housing 10 is introduced in the direction of arrow 19 into the receiving housing 20, the arc-shaped tab portion is moved elastically about the base portion 3, wherein the disk-shaped end 6 providing the support area 21 will come to rest against the support surfaces 22 of the sheet metal 1. In the illustrated embodiment according to FIG. 1B, the support surfaces 22 are formed on the longitudinal edge 23 of the slot 11, respectively, wherein the support surfaces 22 are formed by the edge portions 15 projecting transversely to the longitudinal tab axis 13 into the slot 11. By means of the support surfaces 22 positioned approximately oppositely to one another at a spacing transversely to the longitudinal tab axis 13, the springy contact element is supported on the corresponding support area 21 of the free end 6 on both sides of the longitudinal tab axis 13 so that torsion of the tab 2 about the longitudinal tab axis 13 is precluded. Forces acting in the direction of arrow 19 onto the arc-shaped portion of the tab are thus, on the one hand, elastically supported by the S-shaped portion 17 at the base portion 3 and are dissipated by the support area 21 at the free end 6 onto the support surfaces 22 of the sheet metal 1. The springy contact element according to the invention has a high spring stiffness and ensures a reliable contacting even for changing loads as a result of frequent insertion and removal of the plug-in housing 10. If needed, it can also act as a snap-into-place connection.

The free end 6 in the rest position of the springy contact element 2 can rest against the sheet metal 1. Advantageously, a minimal spacing between the free end 6 and the support surfaces 22 is provided.

When a force acts via the plug-in housing 10, when being mounted, onto the springy contact element in the direction of arrow 19, the springy end 6 rests on the sheet metal 1 and will rub slightly back and forth in the direction of double arrow 24 as a result of the force introduction in the direction of arrow 19. Accordingly, in the area of the free end 6 electrical contacting of the springy contact element with the sheet metal 1 carrying it is ensured so that the arc-shaped tab portion is electrically contacted with the sheet metal 1, on the one hand, by means of the unitary connection with the base portion and, on the other hand, by means of the free end 6 supported on the sheet metal 1. In this connection, as a result of the movement in the direction of double arrow 24, each mounting achieves a rubbing action for cleaning the contact location so that for an extended period of time a reliable contacting is ensured. In the case of contact elements which are formed of coated or lacquered sheet metal, this coating in the area of the electrically conducting contact surfaces 5, 21 is removed or a contact surface is formed by bending or folding.

It may be advantageous to configure the width of the support area 21 before cold forming to be smaller than the spacing a of the support surfaces 22 wherein only after cold forming the width B1 of the support area 21 is obtained which is greater than the spacing a of the support surfaces 22 relative to one another. Decisive in this connection is a sufficient overlap u between the support area 21 and the support surfaces 22 in order to ensure a reliable supporting action and substantially deformation-free dissipation of the support forces into the sheet metal 1 of the housing part.

Figure 1A:
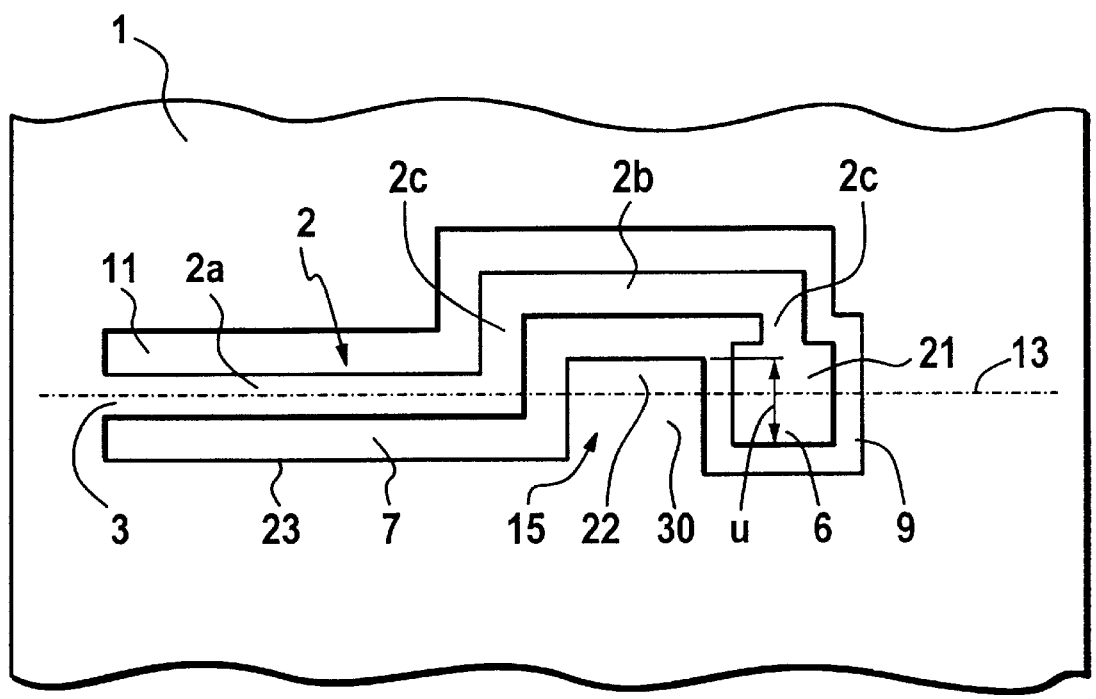
FIG. 1A a plan view onto a sheet metal with a stamped sheet metal tab in a slot.
Figure 1B:
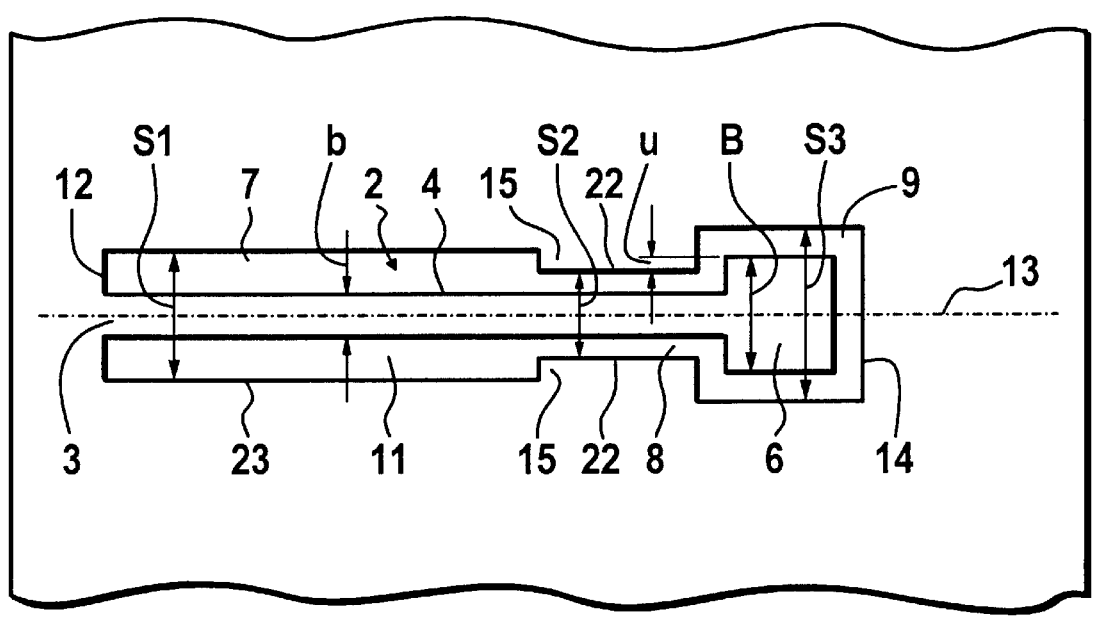
FIG. 1B a plan view onto a sheet metal with stamped straight sheet metal tab in a slot.

It may be sufficient to provide as a support surface 22 simply a sheet metal portion 30 which projects into the longitudinal slot 11, as illustrated in FIG. 1A. The sheet metal tab 2, which is of a straight configuration in FIG. 1B, is guided in FIG. 1A, in a plan view, angularly about the inwardly projecting sheet metal 30 and is thus comprised substantially of two tab portions 2a, 2b, which are approximately parallel to one another, as well as connecting portions 2c extending transversely thereto. The cold forming which is required for obtaining the spring properties is realized substantially within the tab portions 2a and 2b. The shaping required for obtaining the spring properties results in a shortening of the tab 2 in the longitudinal tab direction so that the end 6 will come to rest against the sheet metal portion 30 where it is supported.

What is claimed is:

1. A springy contact element arrangement to be arranged between electrically conducting housing parts (10, 20), wherein a first housing part (20) comprises a sheet metal (1) which is configured to be shaped and has a sheet metal tab (2) located within a slot (11) of the sheet metal (1) and forming a unitary part of the sheet metal (1), wherein the sheet metal tab (2) is cold formed to form a springy contact element and wherein the sheet metal tab (2) has a thickness (d) reduced relative to a thickness of the sheet metal (1) by cold forming the springy contact element, wherein the springy contact element has an arc-shaped tab portion (4) projecting out of a plane (16) of the sheet metal (1), wherein the springy contact element has a base portion (3) and is connected with the base portion (3) to the sheet metal (1), wherein the springy contact element has a support area (21) located at a spacing relative to the base portion (3), wherein the support area (21) of the springy contact element is configured to be supported on at least one support surface (22) of the sheet metal (1), wherein the at least one support surface (22) of the sheet metal (1) extends transversely to a longitudinal tab axis (13) of the sheet metal tab (2) away from a first longitudinal slot edge (23) and engages underneath the support area (21).

2. A contact element arrangement according to claim 1, wherein the at least one support surface (22) is formed by an edge portion (15) of the longitudinal slot edge (23) projecting into the slot (11).

3. A contact element arrangement according to claim 1, wherein the at least one support surface (22) in the direction of the longitudinal slot axis (13) is longer than the support area (21).

4. A contact element arrangement according to claim 1, wherein the support area (21) in the unloaded state of the contact element is positioned at a spacing relative to the support surface (22).

5. A contact element arrangement according to claim 1, wherein the support area (21) rests against the support surface (22) in the unloaded state of the contact element.

6. A contact element arrangement according to claim 1, wherein the sheet metal (1) has two of the support surfaces (22) provided on the first longitudinal slot edge (23) and a second longitudinal slot edge (23) opposite the first longitudinal slot edge (23), wherein the two support surfaces (22) are positioned oppositely to one another at a spacing (a) transversely to the longitudinal tab axis (13).

7. A contact element arrangement according to claim 6, wherein a greatest width (B) of the support area (21) before cold forming is slightly greater than the spacing (a) of the two support surfaces (22).

8. A contact element arrangement according to claim 6, wherein a width of the support area (21), having a width which is smaller than the spacing (a) of the support surfaces (22) before cold forming, is formed to a greater width than the spacing (a) by cold forming.

9. A contact element arrangement according to claim 1, wherein the sheet metal tab (2) has a free end (6) and wherein the support area (21) is formed on the free end (6) of the sheet metal tab (2).

10. A contact element arrangement according to claim 9, wherein the free end (6) of the sheet metal tab (2) is formed to a disk shape when viewed in a plan view.

11. A contact element arrangement according to claim 10, wherein the disk-shaped end (6) is bent about a diameter (18) extending substantially transversely to the longitudinal slot axis (13).

12. A contact element arrangement according to claim 1, wherein the springy contact element has a contact surface (5) positioned between the base portion (3) and the support area (21).

13. A contact element arrangement according to claim 12, wherein the contact surface (5) is located approximately at the highest point of the arc-shaped tab portion (4).

14. A contact element arrangement according to claim 1, wherein the base portion (3) is wave-shaped.

15. A contact element arrangement according to claim 14, wherein the base portion (3) is S-shaped.

* * * * *